United States Patent
Matsumoto et al.

(10) Patent No.: US 10,529,596 B2
(45) Date of Patent: Jan. 7, 2020

(54) CAPACITIVE COUPLING PLASMA PROCESSING APPARATUS AND METHOD FOR USING THE SAME

(71) Applicant: TOKYO ELECTRON LIMITED, Minato-ku (JP)

(72) Inventors: Naoki Matsumoto, Nirasaki (JP);
Chishio Koshimizu, Nirasaki (JP);
Akira Koshiishi, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 362 days.

(21) Appl. No.: 15/432,405

(22) Filed: Feb. 14, 2017

(65) Prior Publication Data

US 2017/0162406 A1 Jun. 8, 2017

Related U.S. Application Data

(60) Continuation of application No. 13/932,567, filed on Jul. 1, 2013, now Pat. No. 9,607,866, which is a (Continued)

(30) Foreign Application Priority Data

Mar. 31, 2005 (JP) .................................. 2005-102953

(51) Int. Cl.
*H01L 21/67* (2006.01)
*C23F 4/00* (2006.01)
*H01J 37/32* (2006.01)

(52) U.S. Cl.
CPC .......... *H01L 21/67069* (2013.01); *C23F 4/00* (2013.01); *H01J 37/3244* (2013.01);
(Continued)

(58) Field of Classification Search
None
See application file for complete search history.

(56) References Cited

U.S. PATENT DOCUMENTS

| | | | |
|---|---|---|---|
| 4,464,223 A | 8/1984 | Gorin | |
| 5,151,845 A | 9/1992 | Watanabe et al. | |
| (Continued) | | | |

FOREIGN PATENT DOCUMENTS

| | | |
|---|---|---|
| JP | 2000-173993 | 6/2000 |
| JP | 2000-323456 | 11/2000 |
| (Continued) | | |

OTHER PUBLICATIONS

Office Action dated on Apr. 21, 2011 in the corresponding Chinese Patent Application No. 200810168380.4 (with Partial English Translation).

(Continued)

*Primary Examiner* — Ram N Kackar
(74) *Attorney, Agent, or Firm* — Oblon, McClelland, Maier & Neustadt, L.L.P.

(57) ABSTRACT

A plasma processing apparatus includes a process container configured to accommodate a target substrate and to be vacuum-exhausted. A first electrode and a second electrode are disposed opposite each other within the process container. The first electrode includes an outer portion and an inner portion both facing the second electrode such that the outer portion surrounds the inner portion. An RF power supply is configured to apply an RF power to the outer portion of the first electrode. A DC power supply is configured to apply a DC voltage to the inner portion of the first electrode. A process gas supply unit is configured to supply a process gas into the process container, wherein plasma of the process gas is generated between the first electrode and the second electrode.

10 Claims, 11 Drawing Sheets

Related U.S. Application Data division of application No. 13/177,195, filed on Jul. 6, 2011, now Pat. No. 8,506,753, which is a division of application No. 11/393,673, filed on Mar. 31, 2006, now Pat. No. 7,993,489.

(60) Provisional application No. 60/666,710, filed on Mar. 31, 2005.

(52) U.S. Cl.
CPC .. *H01J 37/32082* (2013.01); *H01J 37/32532* (2013.01); *H01J 2237/334* (2013.01)

(56) References Cited

U.S. PATENT DOCUMENTS

| | | | |
|---|---|---|---|
| 5,298,103 A * | 3/1994 | Steinberg | H01J 37/32082 156/345.43 |
| 6,070,552 A | 6/2000 | Mizuno | |
| 6,239,403 B1 | 5/2001 | Dible et al. | |
| 6,506,686 B2 | 1/2003 | Masuda et al. | |
| 6,577,113 B2 | 6/2003 | Sill et al. | |
| 6,620,335 B1 | 9/2003 | Deornellas et al. | |
| 7,506,610 B2 | 3/2009 | Koshiishi et al. | |
| 7,537,672 B1 | 5/2009 | Koshiishi et al. | |
| 2003/0052085 A1 | 3/2003 | Parsons | |
| 2003/0106647 A1 | 6/2003 | Koshiishi et al. | |
| 2004/0000875 A1 | 1/2004 | Vahedi et al. | |
| 2004/0035365 A1 | 2/2004 | Yamazawa et al. | |
| 2004/0074609 A1 | 4/2004 | Fischer et al. | |
| 2004/0177927 A1 | 9/2004 | Kikuchi et al. | |
| 2004/0212311 A1 | 10/2004 | Chistyakov | |
| 2005/0061445 A1 | 3/2005 | Koshiishi et al. | |

FOREIGN PATENT DOCUMENTS

| | | |
|---|---|---|
| JP | 2000-323460 A | 11/2000 |
| JP | 2001-250815 | 9/2001 |
| JP | 2004-193566 | 7/2004 |
| JP | 2004-260159 A | 9/2004 |
| TW | 462092 B | 11/2001 |

OTHER PUBLICATIONS

Office Action dated Nov. 27, 2012 in Japanese Patent Application No. 2010-035682.

Office Action dated Mar. 12, 2012 in Chinese Patent Application No. 200810168380.4.

* cited by examiner

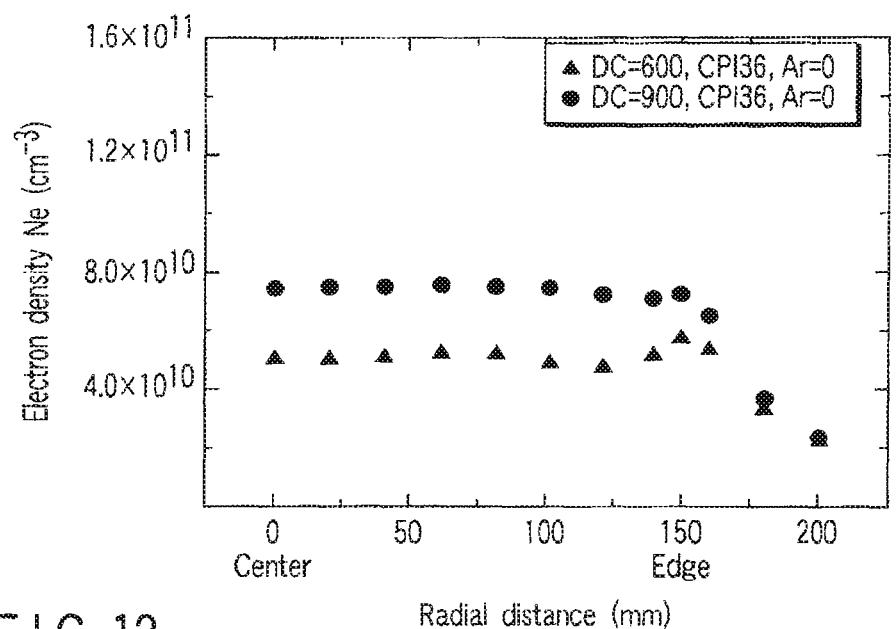
F I G. 12
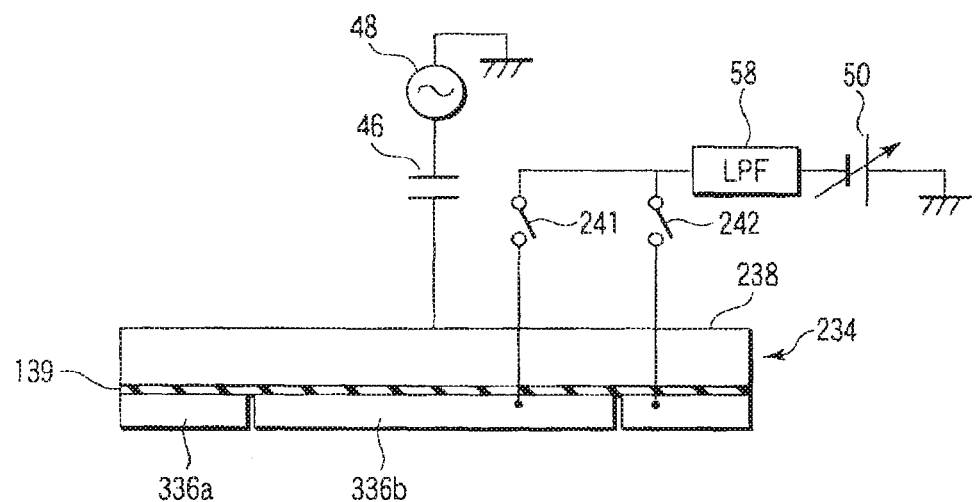
F I G. 13

CAPACITIVE COUPLING PLASMA PROCESSING APPARATUS AND METHOD FOR USING THE SAME

CROSS-REFERENCE TO RELATED APPLICATIONS

The present application is a continuation of U.S. application Ser. No. 13/932,567 filed Jul. 1, 2013. U.S. application Ser. No. 13/932,567 is a divisional application and claims the benefit of priority under 35 U.S.C. § 120 to U.S. application Ser. No. 13/177,195, filed on Jul. 6, 2011, which is a divisional of U.S. application Ser. No. 11/393,673, filed on Mar. 31, 2006, which claims the benefit of U.S. Provisional Application No. 60/666,710, filed Mar. 31, 2005, and claims the benefit of priority under 35 U.S.C. § 119 from Japanese Application No. 2005-102953, filed on Mar. 31, 2005, the entire contents of which are incorporated herein by reference.

BACKGROUND OF THE INVENTION

1. Field of the Invention

The present invention relates to a plasma processing apparatus of the capacitive coupling type and a method for using the same, used for performing a plasma process on a target substrate in, e.g., a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

For example, in manufacturing semiconductor devices, plasma etching processes, which utilize plasma to etch a layer through a resist mask, are often used for forming a predetermined pattern on a predetermined layer disposed on a target substrate or semiconductor wafer. There are various plasma etching apparatuses for performing such plasma etching, but parallel-plate plasma processing apparatuses of the capacitive coupling type are presently in the mainstream.

In general, a parallel-plate plasma etching apparatus of the capacitive coupling type includes a chamber with parallel-plate electrodes (upper and lower electrodes) disposed therein. While a process gas is supplied into the chamber, an RF (radio frequency) is applied to one of the electrodes to form an RF electric field between the electrodes. The process gas is ionized into plasma by the RF electric field, thereby performing a plasma etching process on a semiconductor wafer.

More specifically, there is known a plasma etching apparatus in which an RF power for plasma generation is applied to the upper electrode to generate plasma, while an RF power for ion attraction is applied to the lower electrode. This plasma etching apparatus can form a suitable plasma state and realize an etching process with high selectivity and high reproducibility.

In recent years, miniaturization proceeds in the design rules used for manufacturing processes, and thus plasma processes are required to generate higher density plasma at a lower pressure. Under the circumstances, there is a trend in parallel-plate plasma processing apparatuses of the capacitive coupling type described above, such that the RF power applied to the upper electrode is selected from a range covering higher frequencies (for example, 50 MHz or more) than conventional values (typically, 27 MHz or less) (for example, Jpn. Pat. Appln. KOKAI Publication No. 2000-173993 (Patent Document 1)).

However, if the frequency of the RF power applied to the upper electrode is set higher, when the RF power is supplied from an RF power supply through a feed rod to the electrode backside, it is transmitted through the electrode surface by means of the skin effect and is concentrated at the central portion of the electrode bottom surface (plasma contact surface). Consequently, the electric field intensity at the central portion of the electrode bottom surface becomes higher than the electric field intensity at the peripheral portion, so the density of generated plasma becomes higher at the electrode central portion than at the electrode peripheral portion. This condition brings about a so called center-fast state in the etching process.

In order to solve this problem, a design is known in which the bottom surface central portion of an upper electrode is formed of a high resistivity member (for example, Jpn. Pat. Appln. KOKAI Publication No. 2000-323456 (Patent Document 2)). According to this technique, the high resistivity member is employed for the bottom surface central portion of an upper electrode to consume more RF power as Joule heat there. Consequently, the electric field intensity on the bottom surface (plasma contact surface) of the upper electrode is more reduced at the electrode central portion than at the electrode peripheral portion, so that the poor uniformity described above in plasma density is remedied. However, the structure according to the technique disclosed in Patent Document 2 may consume too much RF power as Joule heat (energy loss).

BRIEF SUMMARY OF THE INVENTION

An object of the present invention is to provide a plasma processing apparatus of the capacitive coupling type and a method for using the same, which can easily attain high plasma uniformity. Another object of the present invention is to provide a plasma processing apparatus of the capacitive coupling type and a method for using the same, which can attain an arbitrary plasma distribution.

According to a first aspect of the present invention, there is provided a plasma processing apparatus comprising:

a process container configured to accommodate a target substrate and to be vacuum-exhausted;

a first electrode and a second electrode disposed opposite each other within the process container, the first electrode comprising an outer portion and an inner portion both facing the second electrode such that the outer portion surrounds the inner portion;

an RF power supply configured to apply an RF power to the outer portion of the first electrode;

a DC power supply configured to apply a DC voltage to the inner portion of the first electrode; and a process gas supply unit configured to supply a process gas into the process container, plasma of the process gas being generated between the first electrode and the second electrode.

According to a second aspect of the present invention, there is provided a method of using the plasma processing apparatus, the plasma processing apparatus comprising a process container configured to accommodate a target substrate and to be vacuum-exhausted, a first electrode and a second electrode disposed opposite each other within the process container, the first electrode comprising an outer portion and an inner portion both facing the second electrode such that the outer portion surrounds the inner portion, an RF power supply configured to apply an RF power to the outer portion of the first electrode, a DC power supply configured to apply a DC voltage to the inner portion of the first electrode, and a process gas supply unit configured to supply a process gas into the process container, plasma of the process gas being generated between the first electrode and the second electrode, the method comprising:

performing control of distribution of the plasma generated between the first electrode and the second electrode by application of the RF power and the DC voltage during a plasma process.

According to a third aspect of the present invention, there is provided a plasma processing apparatus comprising:

a process container configured to accommodate a target substrate and to be vacuum-exhausted;

a first electrode and a second electrode disposed opposite each other within the process container;

an RF power supply configured to apply an RF power to the first electrode;

a DC power supply configured to apply a DC voltage to the first electrode; and a process gas supply unit configured to supply a process gas into the process container, plasma of the process gas being generated between the first electrode and the second electrode, wherein the first electrode has a predetermined distribution of electric resistivity in a planar direction, such that a predetermined distribution of a DC electric field and an RF electric field is formed on the first electrode by application of the RF power and the DC voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 12 is a view showing electron density distributions where a plasma etching was performed in the plasma etching apparatus shown in FIG. 6 while an Ar-less gas composition was used and a DC voltage was applied from the variable DC power supply;

FIG. 13 is a diagram showing the upper electrode structure of a plasma etching apparatus according to a sixth embodiment of the present invention;

DETAILED DESCRIPTION OF THE INVENTION

Figure 1:
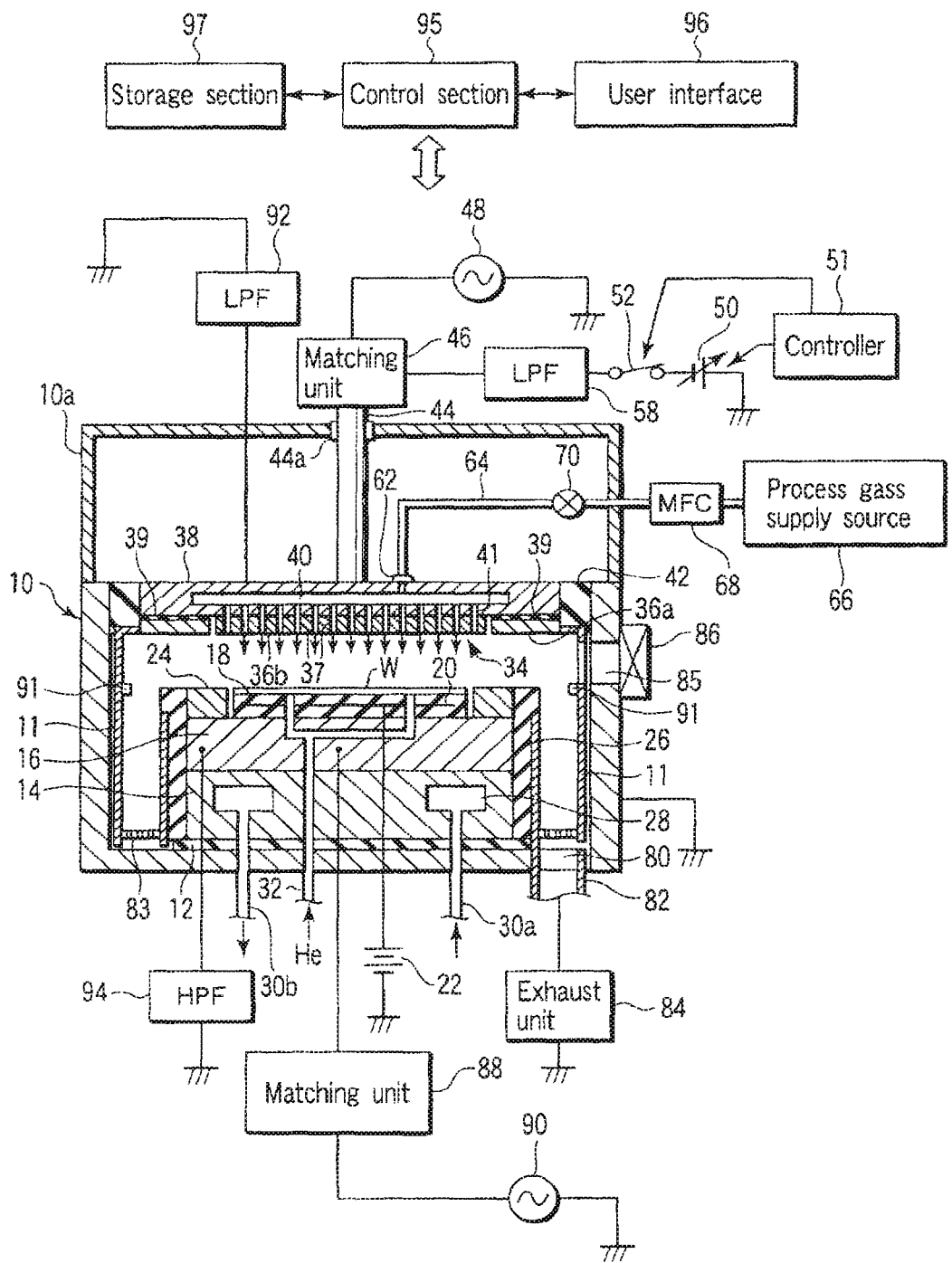
FIG. 1 is a sectional view schematically showing a plasma etching apparatus according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

FIG. 1 is a sectional view schematically showing a plasma etching apparatus according to a first embodiment of the present invention. This plasma etching apparatus is structured as a parallel-plate plasma etching apparatus of the capacitive coupling type. The apparatus includes a cylindrical chamber (process container) 10, which is made of, e.g., aluminum with an anodization-processed surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the target substrate or semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a DC (direct current) power supply 22. The semiconductor wafer W is attracted and held on the electrostatic chuck 18 by an electrostatic attraction force, e.g., a Coulomb force, generated by a DC voltage applied from the DC power supply 22.

A conductive focus ring (correction ring) 24 made of, e.g., silicon is disposed on the top of the susceptor 16 to surround the electrostatic chuck 18 (and the semiconductor wafer W) to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein. A cooling medium set at a predetermined temperature, such as cooling water, is circulated within the cooling medium space 28 from an external chiller unit (not shown) through lines 30*a* and 30*b*. The temperature of the cooling medium is set to control the process temperature of the semiconductor wafer W placed on the susceptor 16. Further, a heat transmission gas, such as He gas, is supplied from a heat transmission gas supply unit (not shown), through a gas supply line 32, into the interstice between the top surface of the electrostatic chuck 18 and the bottom surface of the semiconductor wafer W.

An upper electrode 34 is disposed above the lower electrode or susceptor 16 in parallel with the susceptor. The space between the electrodes 16 and 34 is used as a plasma generation space. The upper electrode 34 defines a surface facing the semiconductor wafer W placed on the lower electrode or susceptor 16, and thus this facing surface is in contact with the plasma generation space.

The upper electrode 34 is supported at the top of the chamber 10 by an insulating shield member 42. The upper electrode 34 includes an outer electrode plate 36*a* having a circular ring shape and a circular inner electrode plate 36*b* surrounded by the outer electrode plate 36*a*. The outer and inner electrode plates 36*a* and 36*b* define the facing surface opposite the susceptor 16 and having a number of gas delivery holes 37. The outer and inner electrode plates 36*a* and 36*b* are detachably supported (physically connected) by an electrode support 38. The electrode support 38 is made of a conductive material, such as aluminum with an anodization-processed surface, and has a water-cooled structure.

A gap is formed between the outer and inner electrode plates 36*a* and 36*b*. A thin dielectric film (insulating film) 39, such as an anodic aluminum oxide film, is interposed between the outer electrode plate 36*a* and the electrode support 38. The outer and inner electrode plates 36*a* and 36*b* are preferably made of a conductor or semiconductor, such as silicon or SiC, having a low resistivity and thus generating less Joule heat. The electrode support 38 has a gas diffusion cell 40 formed therein, which is connected to the gas delivery holes 37 through a number of gas flow channels 41 extending downward.

Further, the electrode support 38 has a gas feed port 62 formed therein for feeding a process gas into the gas diffusion cell 40. The gas feed port 62 is connected to a process gas supply source 66 through a gas supply line 64. The gas supply line 64 is provided with a mass-flow controller (MFC) 68 and a switching valve 70 disposed thereon in this order from the upstream. A process gas for etching, such as a fluorocarbon gas ($C_xF_y$), e.g., $C_4F_8$ gas, is supplied from the process gas supply source 66 through the gas supply line 64 into the gas diffusion cell 40. Then, the process gas flows through the gas flow channels 41 and is delivered from the gas delivery holes 37 into the plasma generation space, as in a shower device. In other words, the upper electrode 34 serves as a showerhead for supplying a process gas.

The upper electrode 34 is electrically connected to a first RF (radio frequency) power supply 48 through a matching unit 46 and a feed rod 44. The first RF power supply 48 outputs an RF power with a frequency of 13.56 MHz or more, such as 60 MHz. The matching unit 46 is arranged to match the load impedance with the internal (or output) impedance of the first RF power supply 48. When plasma is generated within the chamber 10, the matching unit 46 performs control for the output impedance of the first RF power supply 48 to apparently agree with the load impedance. The output terminal of the matching unit 46 is connected to the top of the feed rod 44.

Further, the upper electrode 34 is electrically connected to a variable DC power supply 50 in addition to the first RF power supply 48. The variable DC power supply 50 is preferably formed of a bipolar power supply. Specifically, the variable DC power supply 50 is connected to the upper electrode 34 through a low-pass filter (LPF) 58, and the connection thereof is turned on and off by a relay circuit 52. The LPF 58 is configured to trap the RF power from the first RF power supply 48 and the RF power from a second RF power supply described later. The polarity, current, and voltage of the variable DC power supply 50 and the ON/OFF operation of the relay circuit 52 are controlled by a controller 51.

A DC current from the variable DC power supply 50 flows through the electrode support 38 into the inner electrode plate 36*b*, but does not flow into the outer electrode plate 36*a* because of the presence of the dielectric film 39. The dielectric film 39 is thin enough to allow an RF current from the first RF power supply 48 to flow into the outer electrode plate 36*a*. The material and thickness of the dielectric film 39 are designed such that a DC current from the variable DC power supply 50 cannot substantially pass therethrough, while an RF current from the first RF power supply 48 can pass therethrough.

The sidewall of the chamber 10 extends upward above the height level of the upper electrode 34 and forms a cylindrical grounded conductive body 10*a*. The top wall of the cylindrical grounded conductive body 10*a* is electrically insulated from the upper feed rod 44 by a tube-like insulating member 44*a*.

The susceptor 16 used as a lower electrode is electrically connected to a second RF power supply 90 through a matching unit 88. The RF power supplied from the second RF power supply 90 to the lower electrode or susceptor 16 is used for attracting ions toward the semiconductor wafer W. The second RF power supply 90 outputs an RF power with a frequency of 2 to 27 MHz, such as 2 MHz. The matching unit 88 is arranged to match the load impedance with the internal (or output) impedance of the second RF power supply 90. When plasma is generated within the chamber 10, the matching unit 88 performs control for the internal impedance of the second RF power supply 90 to apparently agree with the load impedance.

The upper electrode 34 is electrically connected to a low-pass filter (LPF) 92, which prevents the RF (60 MHz)

from the first RF power supply 48 from passing through, while it allows the RF (2 MHz) from the second RF power supply 98 to pass through to ground. The low-pass filter (LPF) 92 is preferably formed of an LR filter or LC filter. However, a single conducting wire can apply a sufficiently large reactance to the RF power (60 MHz) from the first RF power supply 48, and thus such a wire may be used in place of the LPF 92. On the other hand, the lower electrode or susceptor 16 is electrically connected to a high-pass filter (HPF) 94, which allows the RF (60 MHz) from the first RF power supply 48 to pass through to ground.

An exhaust port 80 is formed at the bottom of the chamber 10, and is connected to an exhaust unit 84 through an exhaust line 82. The exhaust unit 84 includes a vacuum pump, such as a turbo molecular pump, to reduce the pressure inside the chamber 10 to a predetermined vacuum level. A transfer port 85 for a semiconductor wafer W is formed in the sidewall of the chamber 10, and is opened/closed by a gate valve 86 attached thereon. A deposition shield 11 is detachably disposed along the inner wall of the chamber 10 to prevent etching by-products (deposition) from being deposited on the wall. In other words, the deposition shield 11 constitutes a chamber wall. A deposition shield 11 is also disposed around the inner wall member 26. An exhaust plate 83 is disposed at the bottom of the chamber 10 between the deposition shield 11 on the chamber wall and the deposition shield 11 on the inner wall member 26. The deposition shield 11 and exhaust plate 83 are preferably made of an aluminum body covered with a ceramic, such as $Y_2O_3$.

A conductive member (GND block) 91 is disposed on a portion of the deposition shield 11 that constitutes the chamber inner wall, at a height essentially the same as the wafer W, and is connected to ground in the sense of DC. The GND block 91 allows electrons accumulated in the upper electrode 34 to be released, thereby preventing abnormal electric discharge.

Respective portions of the plasma etching apparatus are connected to and controlled by a control section (process controller) 95. The control section 95 is connected to a user interface 96 including, e.g., a keyboard and a display, wherein the keyboard is used for a process operator to input commands for operating the plasma etching apparatus, and the display is used for showing visualized images of the operational status of the plasma processing apparatus.

Further, the control section 95 is connected to a storage section 97 that stores control programs for the control section 95 to control the plasma etching apparatus so as to perform various processes, and programs or recipes for respective components of the plasma etching apparatus to perform processes in accordance with process conditions. Recipes may be stored in a hard disk or semiconductor memory, or stored in a computer readable portable storage medium, such as a CDROM or DVD, to be attached to a predetermined position in the storage section 97.

A required recipe is retrieved from the storage section 97 and executed by the control section 95 in accordance with an instruction or the like through the user interface 96. Consequently, the plasma etching apparatus can perform a predetermined process under the control of the control section 95.

When an etching process is performed in the plasma etching apparatus described above, the gate valve 86 is first opened, and a semiconductor wafer W to be etched is transferred into the chamber 10 and placed on the susceptor 16. Then, a process gas for etching is supplied from the process gas supply source 66 into the gas diffusion cell 40 at a predetermined flow rate, and then supplied into the chamber 10 through the gas flow channels 41 and gas delivery holes 37. At the same time, the interior of the chamber 10 is exhausted by the exhaust unit 84 to set the pressure inside the chamber 10 to be a predetermined value within a range of, e.g., 0.1 to 150 Pa. The process gas may be selected from various gases conventionally employed, and preferably is a gas containing a halogen element, a representative of which is a fluorocarbon gas ($C_xF_y$), such as $C_4F_8$ gas. Further, the process gas may contain another gas, such as Ar gas or $O_2$ gas.

While the etching gas is supplied into the chamber 10, an RF power (60 MHz) for plasma generation is applied from the first RF power supply 48 to the upper electrode 34 at a predetermined power level to ignite and generate plasma. At the same time, an RF power (2 MHz) for ion attraction is applied from the second RF power supply 90 to the lower electrode or susceptor 16 at a predetermined power level. Further, a predetermined DC voltage is applied from the variable DC power supply 50 to upper electrode 34. Furthermore, a DC voltage is applied from the DC power supply 22 for the electrostatic chuck 18 to the electrode 20 of the electrostatic chuck 18 to fix the semiconductor wafer W on the susceptor 16.

The process gas delivered from the gas delivery holes 37 formed in the inner electrode plate 36b of the upper electrode 34 is ionized into plasma by glow discharge caused between the upper electrode 34 and the lower electrode or susceptor 16. Radicals and ions generated in this plasma are used to etch the target surface of the semiconductor wafer W.

Figure 2:
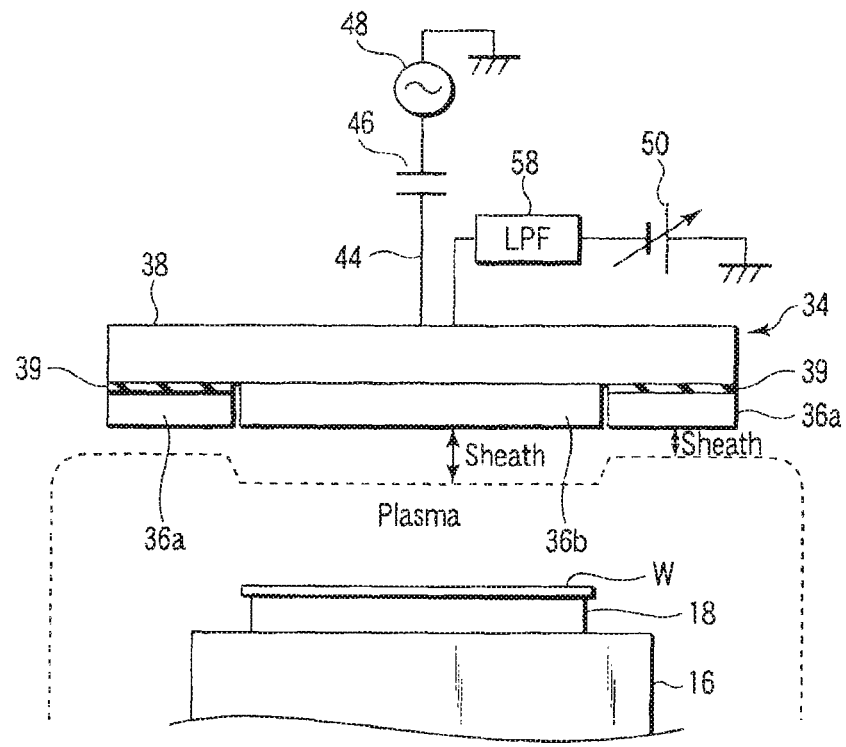
FIG. 2 is a diagram showing the upper electrode structure of the plasma etching apparatus shown in FIG. 1.

FIG. 2 is a diagram showing the upper electrode structure of the plasma etching apparatus shown in FIG. 1. In this embodiment, as schematically shown in FIG. 2, the electrode support 38 is connected to the first RF power supply 48 and the variable DC power supply 50. The electrode plates supported by the electrode support 38 are formed of the outer electrode plate 36a and inner electrode plate 36b, and the dielectric film 39 is interposed between the outer electrode plate 36a and electrode support 38. The dielectric film 39 is arranged to block off a DC current from the variable DC power supply 50 and to transmit an RF current from the first RF power supply 48. Consequently, an RF current flows into both of the outer and inner electrode plates 36a and 36b, while no DC current flows into the outer electrode plate 36a but can flow only into the inner electrode plate 36b. In other words, the electrode support 38 is decoupled for DC and coupled for RF relative to the outer electrode plate 36a. The electrode support 38 is coupled for both DC and RF relative to the inner electrode plate 36b.

In this case, at the inner electrode plate 36b supplied with a DC power, a thick DC sheath is formed near the upper electrode 34 due to the DC voltage. The capacitance of this sheath prevents an RF power from entering, so plasma predominated by the DC power is generated here. On the other hand, at the outer electrode plate 36a in which no DC current flows, no DC sheath is formed, so plasma predominated by the RF power is generated. Thus, DC plasma is becomes dominant in the region corresponding to the inner electrode plate 36b while RF plasma becomes dominant in the region corresponding to the outer electrode plate 36a, in a self-alignment manner.

In general, DC plasma has high uniformity when generated, but it can be maintained only under an electrostatic field. Consequently, plasma is generated in a space between opposed electrodes, but no plasma is generated outside the opposed electrodes. In this case, plasma density becomes higher at the center of the electrodes because there is some outward loss around the opposed electrodes. On the other hand, RF plasma can easily expand outward to the space around opposed electrodes, and high density plasma can be generated around the opposed electrodes.

According to this embodiment, DC plasma is generated mainly at the portion corresponding to the inner electrode plate 36b while RF plasma is generated mainly at the portion corresponding to the outer electrode plate 36a. When a semiconductor wafer is etched, the plasma density (electron density) at the central portion of the wafer is controlled by a DC power, which can realize plasma with high uniformity, while the plasma density (electron density) at the peripheral portion is controlled by an RF power, which can realize plasma expandable outward from the opposed electrodes. In this case, the power of the first RF power supply 48 and variable DC power supply 50 can be controlled to generate plasma with very high uniformity in any situation.

Specifically, for example, where plasma is generated without supply of Ar gas, conventional RF plasma tends to decrease the plasma density at the central portion, which makes the plasma density less uniform. According to this embodiment, even under such a condition, the plasma density can be highly uniform. Further, the powers of the first RF power supply 48 and variable DC power supply 50 can be also controlled to form a predetermined plasma density distribution.

In this embodiment, the first RF power supply 48 supplies the upper electrode 34 with an RF power with a frequency selected from a high frequency range (such as 10 MHz or more, which ions cannot follow). In this case, the etching gas is activated in a state preferable for etching, so that high density plasma can be generated even under a low pressure. Further, the DC power applied from the variable DC power supply 50 helps to generate plasma with a high electron temperature. Consequently, the etching gas is ionized in a state more preferable for etching, so that higher density plasma can be generated.

Where plasma predominated by a DC power is generated at the portion corresponding to the inner electrode plate 36b, the following effects can be obtained. Specifically, the upper electrode 34 is provided with a deep self bias voltage $V_{dc}$ on the surface, so that polymers deposited on the upper electrode 34 are sputtered, thereby cleaning up the surface of the upper electrode 34. Further, an optimum quantity of polymers can be supplied onto the semiconductor wafer W, thereby canceling the surface roughness of a photo-resist film. In addition, since the body of the upper electrode 34 is sputtered and the electrode material is supplied onto the surface of the semiconductor wafer W, the photo-resist film is reinforced by the material. Furthermore, since the thickness of a plasma sheath formed on the upper electrode 34 is increased, as described above, the plasma is compressed by that much. In this case, the effective residence time above the semiconductor wafer W is decreased, and the plasma concentrates above the wafer W with less diffusion, thereby reducing the dissociation space. Consequently, dissociation of a fluorocarbon family process gas is suppressed for the photo-resist film to be less etched.

Incidentally, where a DC voltage is applied to the upper electrode 34, electrons may accumulate on the upper electrode 34 and thereby cause abnormal electric discharge between the upper electrode 34 and the inner wall of the chamber 10. In order to suppress such abnormal electric discharge, this embodiment includes the GND block 91 as a part grounded in the sense of DC, which is disposed on the deposition shield 11 that constitutes the chamber wall. The GND block 91 is exposed to plasma, and is electrically connected to a conductive portion in the deposition shield 11. The DC voltage current applied from the variable DC power supply 50 to the upper electrode 34 flows through the process space to the GND block 91, and is then grounded through the deposition shield 11. The GND block 91 is made of a conductor, and preferably a silicon-containing substance, such as Si or SiC. The GND block 91 may be preferably made of C. The GND block 91 allows electrons accumulated in the upper electrode 34 to be released, thereby preventing abnormal electric discharge. The GND block 91 preferably has a protruding length of 10 mm or more.

The position of the GND block 91 is not limited to that shown in FIG. 1, as long as it is disposed in the plasma generation area. For example, the GND block 91 may be disposed on the susceptor 16 side, e.g., around the susceptor 16. Alternatively, the GND block 91 may be disposed near the upper electrode 34, e.g., as a ring disposed outside the upper electrode 34.

Figure 3:
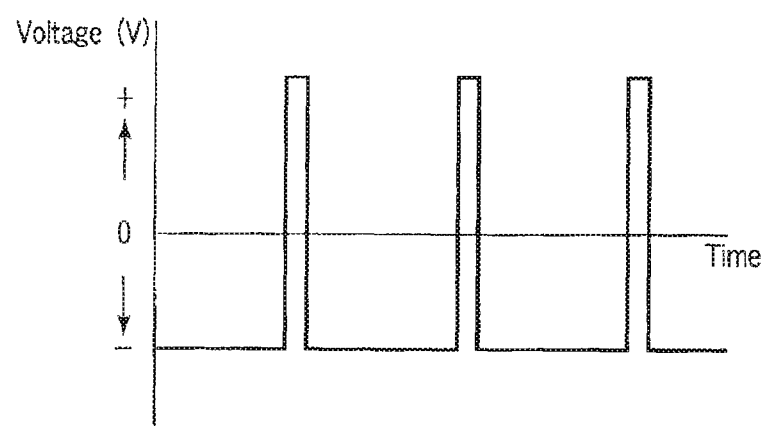
FIG. 3 is a view showing a waveform for suppressing abnormal electric discharge where a DC (direct current) voltage is applied to the upper electrode in the plasma etching apparatus shown in FIG. 1.

FIG. 3 is a view showing a waveform for suppressing abnormal electric discharge where a DC voltage is applied to the upper electrode in the plasma etching apparatus shown in FIG. 1. Specifically, in order to prevent abnormal electric discharge, a method may be effectively used of superposing very short periodic pulses of the opposite polarity, as shown in FIG. 3, by suitable means, with the DC voltage applied to the upper electrode 34, so as to neutralize electrons.

Second Embodiment

Figure 4:
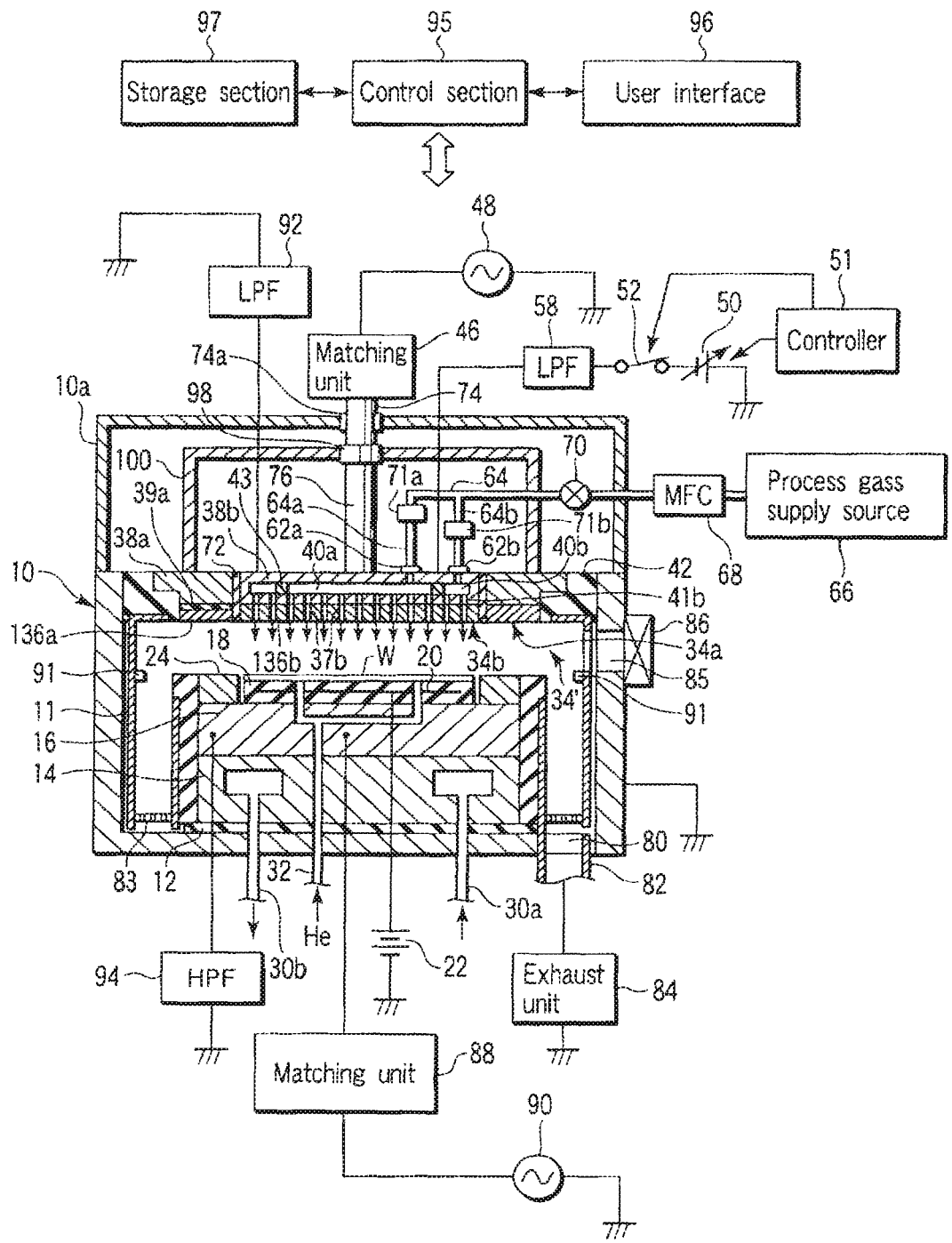
FIG. 4 is a sectional view schematically showing a plasma etching apparatus according to a second embodiment of the present invention.

FIG. 4 is a sectional view schematically showing a plasma etching apparatus according to a second embodiment of the present invention. In place of the upper electrode 34 of the first embodiment, this embodiment includes an upper electrode 34' having the following structure. Specifically, the upper electrode 34' comprises an outer upper electrode 34a and an inner upper electrode 34b. The outer upper electrode 34a has a ring shape or doughnut shape and is disposed to face a susceptor 16 at a predetermined distance. The inner upper electrode 34b has a circular plate shape and is disposed radially inside the outer upper electrode 34a while being insulated therefrom. The outer upper electrode 34a is separated from the inner upper electrode 34b by an annular gap (slit) of, e.g., 0.25 to 2.0 mm, in which a dielectric body 72 made of, e.g., quartz is disposed. An insulating shield member 42 made of, e.g., alumina ($Al_2O_3$) and having a ring shape is airtightly interposed between the outer upper electrode 34a and the sidewall of a chamber 10.

The outer upper electrode 34a includes an electrode plate 136a, and an electrode support 38a detachably supporting the electrode plate 136a. The electrode support 38a is made of a conductive material, such as aluminum with an anodization-processed surface. A thin dielectric film 39a, such as an anodic aluminum oxide film, is interposed between the electrode support 38a and electrode plate 136a. The electrode plate 136a is preferably made of a conductor or semiconductor, such as silicon or SiC, having a low resistivity to generate a small Joule heat. The outer upper electrode 34a is electrically connected to a first RF power supply 48 the same as that of the first embodiment through a matching unit 46, an upper feed rod 74, a connector 98, and a feed cylinder 100, the same as those of the first embodiment. The output terminal of the matching unit 46 is connected to the top of the upper feed rod 74.

The feed cylinder 100 has a cylindrical or conical shape, or a shape similar thereto, and formed of a conductive plate, such as an aluminum plate or copper plate. The bottom end of the feed cylinder 100 is connected to the outer upper electrode 34a continuously in an annular direction. The top of the feed cylinder 100 is electrically connected to the bottom of the upper feed rod 74 through the connector 98. Outside the feed cylinder 100, the sidewall of the chamber 10 extends upward above the height level of the upper electrode 34' and forms a cylindrical grounded conductive body 10a. The top of the cylindrical grounded conductive body 10a is electrically insulated from the upper feed rod 74 by a tube-like insulating member 74a. According to this design, the load circuit extending from the connector 98 comprises a coaxial path formed of the feed cylinder 100 and outer upper electrode 34a and the cylindrical grounded conductive body 10a, wherein the feed cylinder 100 and outer upper electrode 34a function as a waveguide.

The inner upper electrode 34b includes an electrode plate 136b having a number of gas delivery holes 37b, and an electrode support 38b detachably supporting the electrode plate 136b. The electrode support 38b is made of a conductive material, such as aluminum with an anodization-processed surface. The electrode support 38b has two gas diffusion cells, i.e., a central gas diffusion cell 40a and a peripheral gas diffusion cell 40b, formed therein and separated by an annular partition member 43, such as an O-ring. The central gas diffusion cell 40a and peripheral gas diffusion cell 40b are connected to the gas delivery holes 37b through a number of gas flow channels 41b extending downward. The central gas diffusion cell 40a, part of a number of gas flow channels 41b disposed therebelow, and part of a number of gas delivery holes 37b connected thereto constitute a central showerhead. The peripheral gas diffusion cell 40b, part of a number of gas flow channels 41b disposed therebelow, and part of a number of gas delivery holes 37b connected thereto constitute a peripheral showerhead.

The gas diffusion cells 40a and 40b are supplied with a process gas from a common process gas supply source 66 at a predetermined flow-rate ratio. More specifically, a gas supply line 64 is extended from the process gas supply source 66 and divided into two branch lines 64a and 64b connected to the gas diffusion cells 40a and 40b. The branch lines 64a and 64b are connected to gas feed ports 62a and 62b formed in the electrode support 38b, so that the process gas is supplied through the gas feed ports 62a and 62b into the gas diffusion cells 40a and 40b. The branch lines 64a and 64b are provided with flow rate control valves 71a and 71b disposed thereon, respectively. The conductance values of the flow passages from the process gas supply source 66 to the gas diffusion cells 40a and 40b are equal to each other. Accordingly, the flow-rate ratio of the process gas supplied into the central gas diffusion cell 40a and peripheral gas diffusion cell 40b is arbitrarily adjusted by adjusting the flow rate control valves 71a and 71b. The gas supply line 64 is provided with a mass-flow controller (MFC) 68 and a switching valve 70 disposed thereon, as in the first embodiment. The flow-rate ratio of the process gas supplied into the central gas diffusion cell 40a and peripheral gas diffusion cell 40b is thus adjusted. Consequently, the ratio (FC/FE) between the gas flow rate FC from the central showerhead and the gas flow rate FE from the peripheral showerhead is arbitrarily adjusted. The flow rates per unit area may be set different, for the process gas delivered from the central showerhead and peripheral showerhead. Further, gas types or gas mixture ratios may be independently or respectively selected, for the process gas delivered from the central showerhead and peripheral showerhead.

The electrode support 38b of the inner upper electrode 34b is electrically connected to the first RF power supply 48 the same as that of the first embodiment through the matching unit 46, upper feed rod 74, connector 98, and lower feed rod 76, as in the first embodiment. The upper electrode 34' is further connected to a variable DC power supply 50 the same as that of the first embodiment. Specifically, the variable DC power supply 50 is connected to the inner upper electrode 34b through a low-pass filter (LPF) 58. The polarity, current, and voltage of the variable DC power supply 50 and the ON/OFF operation of the relay circuit 52 are controlled by a controller 51, as in the first embodiment.

When an etching process is performed in the plasma etching apparatus having this structure, an etching target or semiconductor wafer W is transferred into the chamber 10 and placed on the susceptor 16, as in the first embodiment. Then, a process gas for etching is supplied from the process gas supply source 66 into the central gas diffusion cell 40a and peripheral gas diffusion cell 40b at predetermined flow rates and flow-rate ratio to deliver the gas into the chamber 10 through the gas delivery holes 37b. At the same time, the exhaust unit 84 is used to exhaust the chamber 10 to maintain the pressure therein at a set value, as in the first embodiment.

While the etching gas is supplied into the chamber 10, an RF power for plasma generation (60 MHz) is applied from the first RF power supply 48 to the upper electrode 34' at a predetermined power level to ignite and generate plasma. At the same time, an RF for ion attraction (2 MHz) is applied from the second RF power supply 90 to the lower electrode or susceptor 16 at a predetermined power level. Further, a predetermined voltage is applied from the variable DC power supply 50 to the inner upper electrode 34b. Furthermore, a DC voltage is applied from the DC power supply 22 to the electrode 20 of the electrostatic chuck 18 to fix the semiconductor wafer W on the susceptor 16.

The etching gas delivered from the gas delivery holes 37b of the inner upper electrode 34b is ionized into plasma by glow discharge between the upper electrode 34' and lower electrode or susceptor 16. Radicals and ions generated in this plasma are used to etch the target surface of the semiconductor wafer W.

Figure 5:
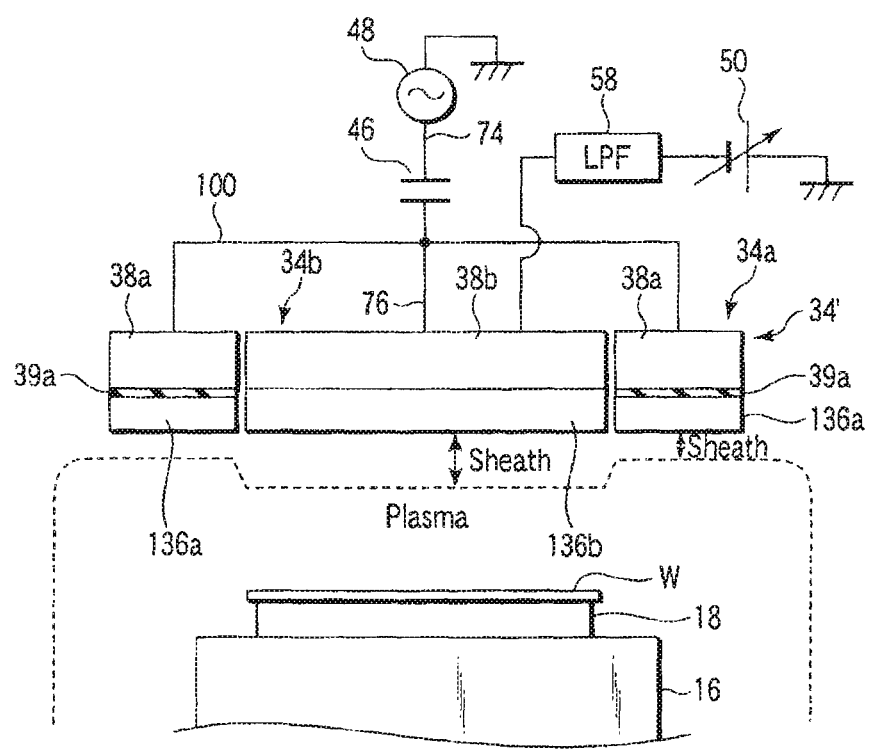
FIG. 5 is a diagram showing the upper electrode structure of the plasma etching apparatus shown in FIG. 4.

FIG. 5 is a diagram showing the upper electrode structure of the plasma etching apparatus shown in FIG. 4. In this embodiment, as schematically shown in FIG. 5, the upper electrode 34' is formed of the outer upper electrode 34a and inner upper electrode 34b separated from each other. The first RF power supply 48 is connected to the outer upper electrode 34a and inner upper electrode 34b through the upper feed rod 74, lower feed rod 76, and feed cylinder 100. The variable DC power supply 50 is connected only to the inner upper electrode 34b. The dielectric film 39a is interposed between the outer electrode plate 136a and electrode support 38a of the outer upper electrode 34a. The dielectric film 39a is arranged to block off a DC current from the variable DC power supply 50 and to transmit an RF current from the first RF power supply 48. Consequently, an RF current flows into both of the outer and inner electrode plates 136a and 136b, while no DC current flows into the outer electrode plate 136a but can flow only into the inner electrode plate 136b.

In this case, near the surface of the inner electrode plate 136b supplied with a DC power, a thick DC sheath is formed due to the DC voltage. The capacitance of this sheath prevents an RF power from entering, so plasma predominated by the DC power is generated here. On the other hand, at the outer electrode plate 136a in which no DC current flows, no DC sheath is formed, so plasma predominated by the RF power is generated. Thus, DC plasma becomes dominant in the region corresponding to the inner electrode plate 136b while RF plasma becomes dominant in the region corresponding to the outer electrode plate 136a, in a self-alignment manner. Consequently, it is possible to uniformize the plasma density on the basis of the same mechanism as in the first embodiment. Further, it is possible to form a predetermined plasma density distribution.

Further, in the upper electrode 34', the inner upper electrode 34b is also used as a showerhead directly across the semiconductor wafer W, such that the flow-rate ratio of the gas delivered from the central showerhead and peripheral showerhead can be arbitrarily adjusted. Consequently, the spatial distribution of gas molecular or radical density can be controlled in the radial direction, so as to arbitrarily control the spatial distribution of an etching characteristic on the basis of radicals.

Third Embodiment

Figure 6:
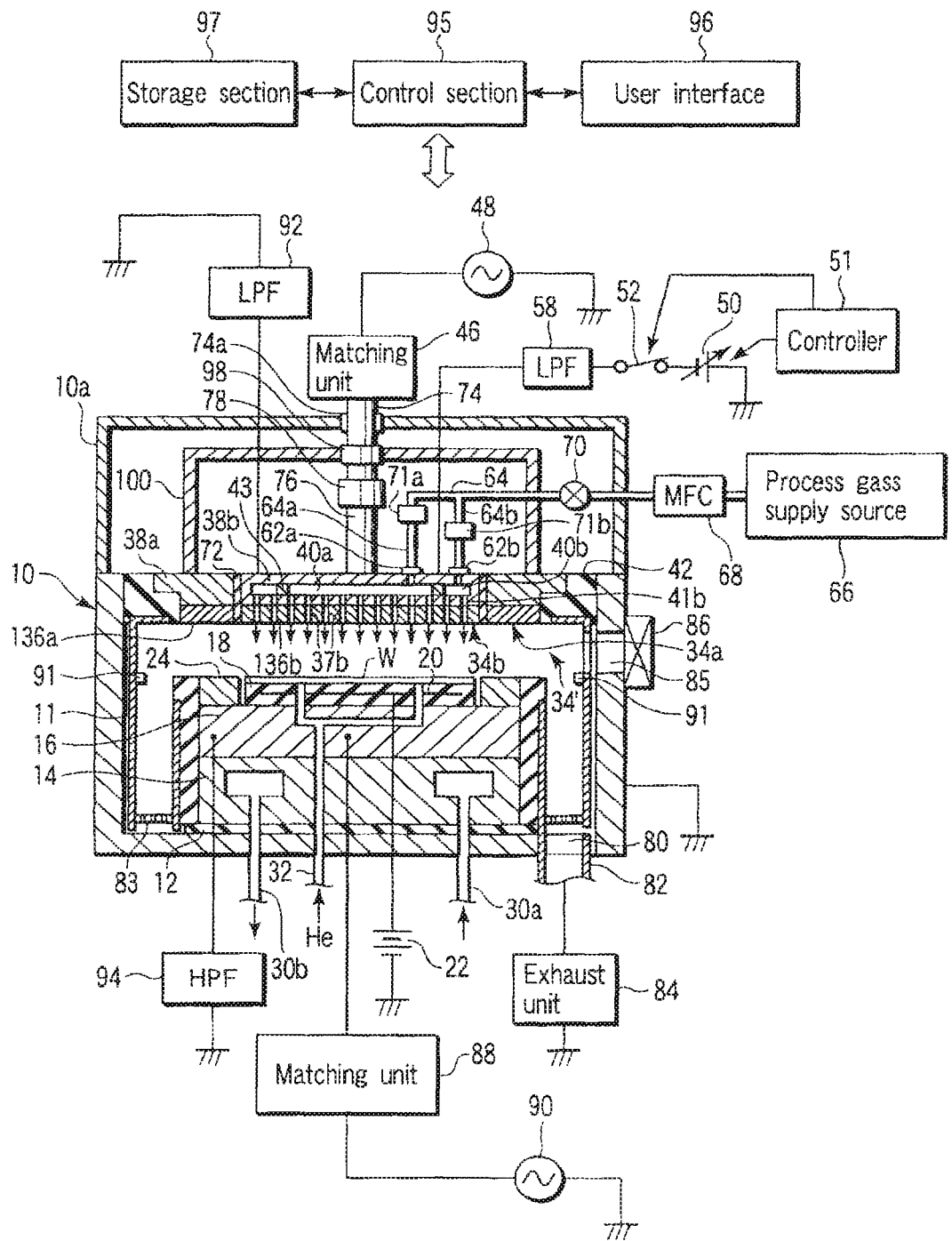
FIG. 6 is a sectional view schematically showing a plasma etching apparatus according to a third embodiment of the present invention.

FIG. 6 is a sectional view schematically showing a plasma etching apparatus according to a third embodiment of the present invention. This embodiment is the same as the second embodiment except that a lower feed rod 76 is provided with a variable capacitor 78 that can adjust its capacitance, and an outer upper electrode 34a includes no dielectric film between an outer electrode plate 136a and an electrode support 38a. The variable capacitor 78 can adjust the balance between the outer electric field intensity and inner electric field intensity, as described later.

Figure 7:
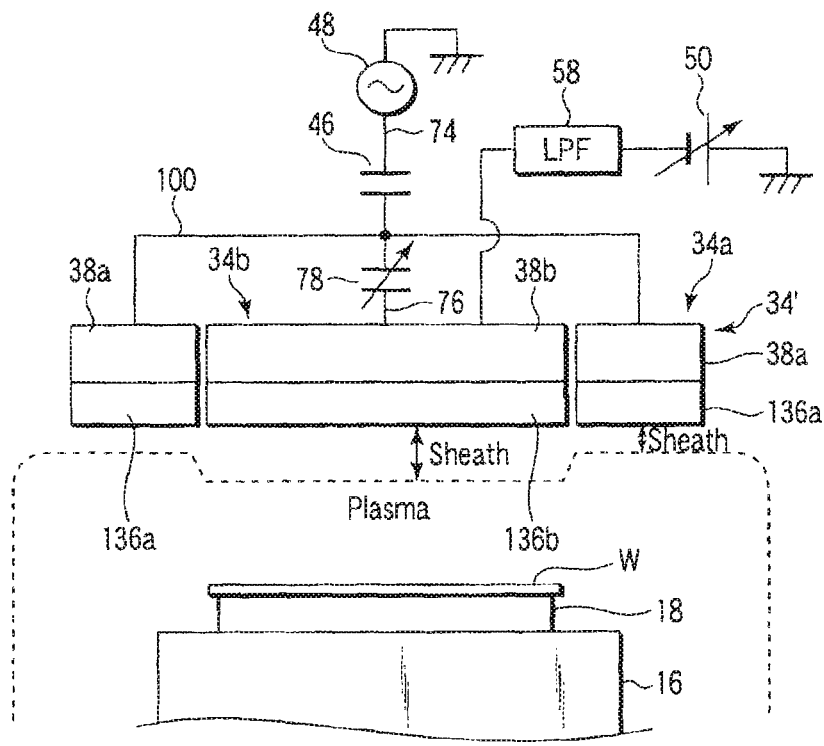
FIG. 7 is a diagram showing the upper electrode structure of the plasma etching apparatus shown in FIG. 6.

FIG. 7 is a diagram showing the upper electrode structure of the plasma etching apparatus shown in FIG. 6. In this embodiment, as schematically shown in FIG. 7, the upper electrode 34' is formed of an outer upper electrode 34a and an inner upper electrode 34b separated from each other. A first RF power supply 48 is connected to the outer upper electrode 34a and inner upper electrode 34b through an upper feed rod 74, a lower feed rod 76, and a feed cylinder 100. A variable DC power supply 50 is connected only to the inner upper electrode 34b. A variable capacitor 78 is disposed on the lower feed rod 76.

In this embodiment, plasma etching is performed in basically the same manner as in the first and second embodiments. At this time, an RF current from the first RF power supply 48 flows into both of the outer and inner electrode plates 136a and 136b through the upper feed rod 74, lower feed rod 76, and feed cylinder 100. On the other hand, a DC current from the variable DC power supply 50 flows into the inner electrode plate 136b, but does not flow into the outer electrode plate 136a because the route through the lower feed rod 76 and feed cylinder 100 is cut off by the variable capacitor 78.

In this case, near the surface of the inner electrode plate 136b supplied with a DC power, a thick DC sheath is formed due to the DC voltage. The capacitance of this sheath prevents an RF power from entering, so plasma predominated by the DC power is generated here. On the other hand, at the outer electrode plate 136a in which no DC current flows, no DC sheath is formed, so plasma predominated by the RF power is generated. Thus, DC plasma is becomes dominant in the region corresponding to the inner electrode plate 136b while RF plasma becomes dominant in the region corresponding to the outer electrode plate 136a. Consequently, it is possible to uniformize the plasma density on the basis of the same mechanism as in the first embodiment. Further, it is possible to form a predetermined plasma density distribution.

In this embodiment, since a thick DC sheath is formed near the surface of the inner electrode plate 136b, most of the RF power is applied to the outer electrode plate 136a, in general. However, where the DC power from the variable DC power supply 50 is relatively small, the distribution ratio of the RF power between the outer electrode plate 136a and inner electrode plate 137b can be adjusted to some extent by changing the capacitance of the variable capacitor 78. Specifically, the capacitance of the variable capacitor 78 can be adjusted to increase or decrease the impedance or reactance of the feed line connected to the inner electrode plate 136b. This makes it possible to change the relative ratio between the voltage drop through the feed line connected to the outer electrode plate 136a and the voltage drop through the feed line connected to the inner electrode plate 136b. Consequently, it is possible to adjust the ratio between the RF power applied to the outer electrode plate 136a and the RF power applied to the inner electrode plate 136b.

Fourth Embodiment

Figure 8:
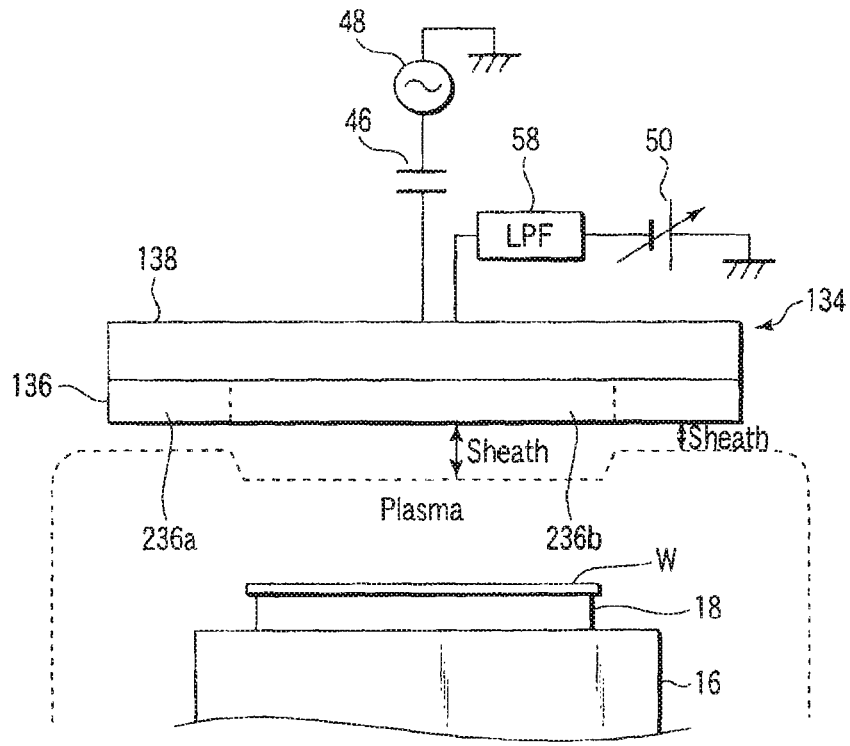
FIG. 8 is a diagram showing the upper electrode structure of a plasma etching apparatus according to a fourth embodiment of the present invention.

FIG. 8 is a diagram showing the upper electrode structure of a plasma etching apparatus according to a fourth embodiment of the present invention. The plasma etching apparatus according to this embodiment has the same basic structure as the plasma etching apparatus shown in FIG. 1 according to the first embodiment. However, as schematically shown in FIG. 8, this embodiment differs in that an upper electrode 134 has a structure in which a single electrode plate 136 is supported by an electrode support 138. The electrode plate 136 comprises an outer portion 236a made of a material having a high electric resistivity, and an inner portion 236b made of a material having a low electric resistivity. The electrode support 138 of the upper electrode 134 is electrically connected to a first RF power supply 48 and a variable DC power supply 50, as in the first embodiment.

The resistivity of the outer portion 236a of the electrode plate 136 is set to be high enough to prevent a DC current from the variable DC power supply 50 from flowing therethrough. The resistivity of the inner portion 236b of the electrode plate 136 is set to be low enough to allow a DC current from the variable DC power supply 50 to sufficiently flow therethrough. Such a resistivity difference can be realized by various methods, such a method of using a doping technique and a method of bonding different materials.

In this embodiment, plasma etching is performed in basically the same manner as in the first to third embodiments. At this time, an RF current from the first RF power supply 48 flows into both of the outer and inner portions 236a and 236b through the electrode support 138. On the other hand, a DC current from the variable DC power supply 50 flows into the inner portion 236b having a lower resistivity, but does not flow into the outer portion 236a having a higher resistivity.

Accordingly, also in this embodiment, near the surface of the inner portion 236b supplied with a DC power, a thick DC sheath is formed due to the DC voltage. The capacitance of this sheath prevents an RF power from entering, so plasma predominated by the DC power is generated here. On the other hand, at the outer portion 236a in which no DC current flows, no DC sheath is formed, so plasma predominated by the RF power is generated. Thus, DC plasma is becomes dominant in the region corresponding to the inner portion 236b while RF plasma becomes dominant in the region corresponding to the outer portion 236a. Consequently, it is possible to uniformize the plasma density on the basis of the same mechanism as in the first embodiment. Further, it is possible to form a predetermined plasma density distribution.

Fifth Embodiment

Figure 9:
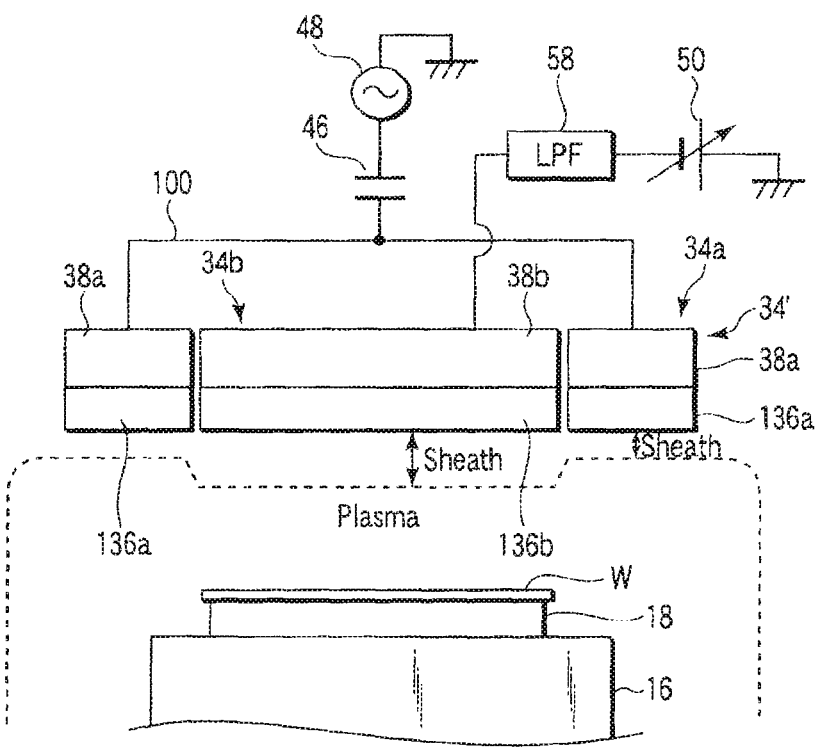
FIG. 9 is a diagram showing the upper electrode structure of a plasma etching apparatus according to a fifth embodiment of the present invention.

FIG. 9 is a diagram showing the upper electrode structure of a plasma etching apparatus according to a fifth embodiment of the present invention. The plasma etching apparatus according to this embodiment has the same basic structure as the plasma etching apparatus shown in FIG. 6 according to the third embodiment. However, as schematically shown in FIG. 9, this embodiment differs in that it includes neither lower feed rod 76 nor variable capacitor 78.

An upper electrode 34' is formed of an outer upper electrode 34a and an inner upper electrode 34b separated from each other. A first RF power supply 48 is connected only to the outer upper electrode 34a through an upper feed rod 74 and a feed cylinder 100. A variable DC power supply 50 is connected only to the inner upper electrode 34b.

In this embodiment, plasma etching is performed in basically the same manner as in the first to third embodiments. At this time, an RF current from the first RF power supply 48 flows only into the outer electrode plate 136a of the outer upper electrode 34a. On the other hand, a DC current from the variable DC power supply 50 flows only into the inner electrode plate 136b of the inner upper electrode 34b.

Accordingly, also in this embodiment, near the surface of the inner electrode plate 136b supplied with a DC power, plasma predominated by the DC power is generated here. On the other hand, near the surface of the outer electrode plate 136a supplied with an RF power, plasma predominated by the RF power is generated. Consequently, it is possible to uniformize the plasma density on the basis of the same mechanism as in the first embodiment. Further, it is possible to form a predetermined plasma density distribution. Furthermore, in this embodiment, plasma is generated only by the DC power near the surface of the inner electrode plate 136b while plasma is generated only by the RF power near the surface of the outer electrode plate 136a. Consequently, as compared to the first to fourth embodiments, it is possible to uniformize the plasma density and form a predetermined plasma density distribution with higher controllability.

Matters Common to First to Fifth Embodiments

The first to fifth embodiments utilize substantially the same mechanism to uniformize the plasma density. An experiment concerning such plasma density control was performed, using the plasma etching apparatus shown in FIG. 6 according to the third embodiment.

At first, in the apparatus shown in FIG. 6, plasma etching was performed under via-etching conditions. Specifically, a semiconductor wafer was loaded into the chamber 10 and placed on the susceptor 16. Then, the chamber 10 was supplied with a process gas comprising $C_4F_8$ gas, Ar gas, and $N_2$ gas set at flow rates of 8 mL/min, 1,000 mL/min, and 150 mL/min, respectively, and the pressure inside the chamber was set at 6.7 Pa. Further, an RF power with 60 MHz at 1,000 W was applied to the upper electrode 34', while an RF power with 2 MHz at 3,000 W was applied to the lower electrode or susceptor 16. Under these conditions, the voltage of the variable DC power supply 50 was changed. The step number of the variable capacitor (CPI) 78 was set at a constant value of 136. During the process, the plasma electron density (plasma density) distribution above the semiconductor wafer was measured.

Figure 10:
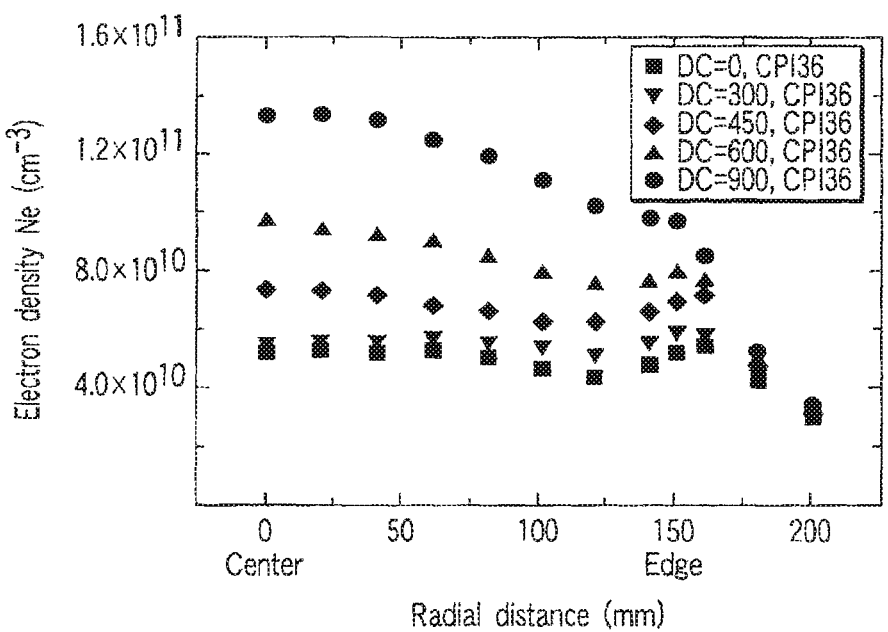
FIG. 10 is a view showing electron density distributions where the DC voltage of a variable DC power supply was changed in the plasma etching apparatus shown in FIG. 6.

FIG. 10 is a view showing electron density distributions obtained by this experiment where the DC voltage of the variable DC power supply 50 was changed. In FIG. 10, the value of the DC voltage (DC) is denoted by absolute values. As shown in FIG. 10, it was confirmed that the electron density was changed at the central portion of the semiconductor wafer with change in the application DC voltage, and the electron density uniformity was improved when the DC voltage was set at about 300V and 450V.

Next, in the apparatus shown in FIG. 6, plasma etching was performed under conditions different from those described above. Specifically, while the process gas composition and pressure were set to be the same as those described above, an RF power with 60 MHz at 1,200 W was applied to the upper electrode 34', while an RF power with 2 MHz at 2,000 W was applied to the lower electrode or susceptor 16. Under these conditions, a first example was performed to measure the plasma density distribution, where the voltage of the variable DC power supply 50 was changed while the step number of the variable capacitor (CPI) 78 was set at a constant value of 136. Further, a second example was performed to measure the plasma density distribution, where the step number of the variable capacitor (CPI) 78 was changed while the voltage of the variable DC power supply 50 was not applied.

Figure 11A:
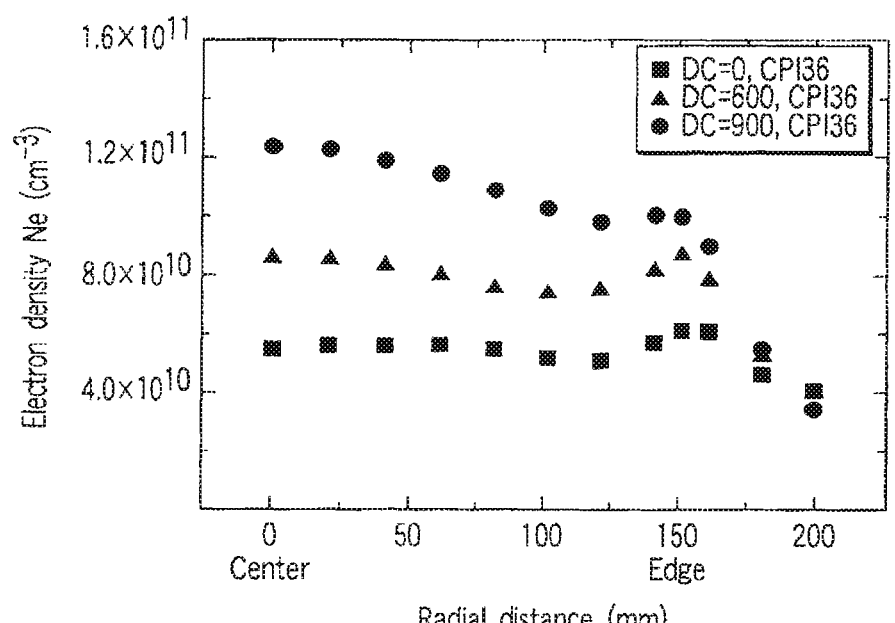
FIGS. 11A and 11B are views showing electron density distributions where the DC voltage of the variable DC power supply was changed and where the capacitance of a variable capacitor was changed while no DC voltage was applied, both in the plasma etching apparatus shown in FIG. 6.
Figure 11B:
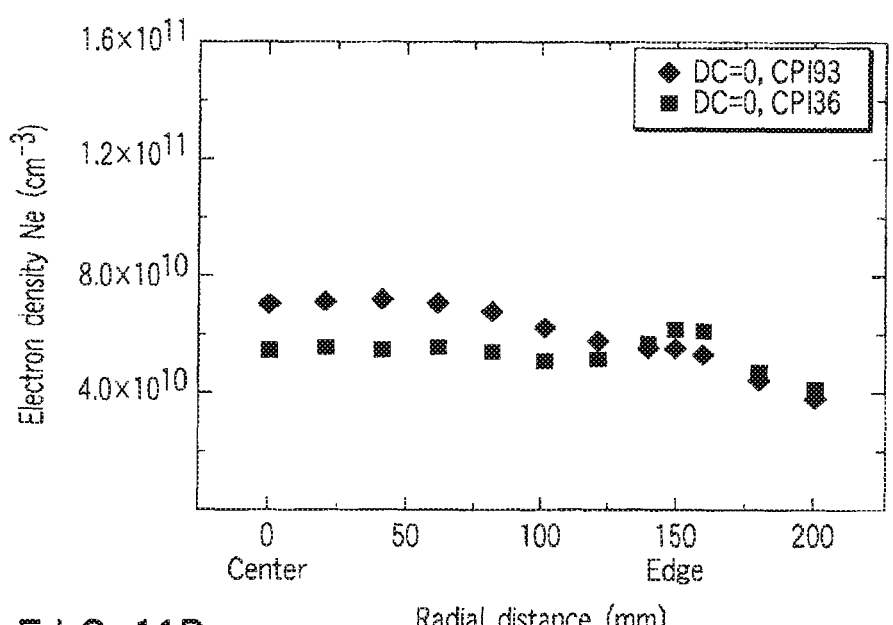

FIG. 11A is a view showing electron density distributions obtained by the first example where the DC voltage of the variable DC power supply 50 was changed. FIG. 11B is a view showing electron density distributions obtained by the second example where the step number of variable capacitor (CPI) 78 was changed. In FIGS. 11A and 11B, the value of the DC voltage (DC) is denoted by absolute values. As shown in FIGS. 11A and 11B, it was confirmed that the two examples rendered almost the same levels of the electron density uniformity, wherein the electron density was controlled in a wide range by the DC voltage, so the flexibility of the plasma density distribution was high.

Next, in the apparatus shown in FIG. 6, plasma etching was performed under conditions further different from those described above. Specifically, the chamber 10 was supplied with an Ar-less process gas by setting $C_4F_8$ gas, Ar gas, and $N_2$ gas at flow rates of 8 mL/min, 0 mL/min, and 150 mL/min, respectively, and the pressure inside the chamber was set at 6.7 Pa. Further, an RF power with 60 MHz at 1,000 W was applied to the upper electrode 34', while an RF power with 2 MHz at 3,000 W was applied to the lower electrode or susceptor 16. Under these conditions, the voltage of the variable DC power supply 50 was set at 600V and 900V. The step number of the variable capacitor (CPI) 78 was set at a constant value of 136. During the process, the plasma electron density (plasma density) distribution above the semiconductor wafer was measured.

FIG. 12 is a view showing electron density distributions obtained by this experiment where an Ar-less gas composition was used while the DC voltage of the variable DC power supply 50 was applied. In FIG. 12, the value of the DC voltage (DC) is denoted by absolute values. As shown in FIG. 12, the electron density uniformity was essentially good when the DC voltage was set at 600V. In the case of this gas composition, it was impossible to obtain good plasma uniformity only by adjusting the variable capacitor (CPI) 78 without using the DC voltage application.

In the first to fifth embodiment, when a plasma etching is performed, a control is performed such that the variable DC power supply 50 applies a DC voltage to the upper electrode, while the first RF power supply 48 applies an RF power to the upper electrode and the second RF power supply 90 applies an RF power to the susceptor 16. On the other hand, when cleaning is performed for the interior of the chamber, a control is preferably performed such that the variable DC power supply 50 does not apply a DC voltage to the upper electrode, while the first RF power supply 48 applies an RF power to the upper electrode and the second RF power supply 90 applies an RF power to the susceptor 16. In other words, the relay circuit 52 is preferably turned off for the cleaning. These operations are controlled by the control section 95.

Sixth Embodiment

FIG. 13 is a diagram showing the upper electrode structure of a plasma etching apparatus according to a sixth embodiment of the present invention. In this embodiment, as schematically shown in FIG. 13, the upper electrode 234 includes an outer electrode plate 336a having a circular ring shape and a circular inner electrode plate 336b surrounded by the outer electrode plate 336a. The outer and inner electrode plates 336a and 336b define a facing surface opposite a susceptor and having a number of gas delivery holes. The outer and inner electrode plates 336a and 336b are supported by an electrode support 238. A gap is formed between the outer and inner electrode plates 336a and 336b. A thin dielectric film 139, such as an anodic aluminum oxide film, is interposed between the outer electrode plate 336a and inner electrode plate 336b and the electrode support 238. The thickness of the dielectric film 139 is set to allow an RF current from a first RF power supply 48 to pass therethrough, and to prevent a DC current from a variable DC power supply 50 from passing therethrough.

The first RF power supply 48 is connected to the electrode support 238. The variable DC power supply 50 is connected to the outer electrode plate 336a and inner electrode plate 336b through switches 241 and 242. Accordingly, it is possible to selectively apply the DC voltage to either, both, or neither of the outer electrode plate 336a and inner electrode plate 336b. The other structures of this embodiment are the same as those shown in FIG. 1.

In this embodiment, when plasma etching is performed, the RF voltage from the first RF power supply 48 is applied to both of the outer electrode plate 336a and inner electrode plate 336b. The DC voltage from the variable DC power supply 50 is selectively applied to the outer electrode plate 336a and inner electrode plate 336b. The DC voltage can be turned on and off independently from each other between the outer electrode plate 336a and inner electrode plate 336b. Consequently, the controllability of the plasma density distribution is remarkably improved, so the flexibility of the plasma density distribution becomes higher.

Figure 14:
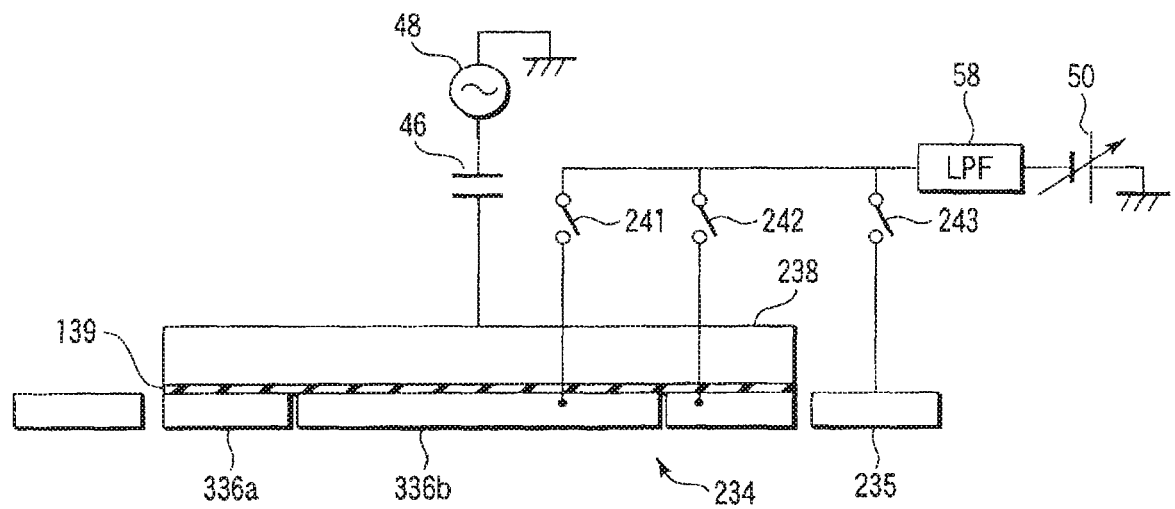
FIG. 14 is a diagram showing the upper electrode structure of a plasma etching apparatus according to a modification of the sixth embodiment of the present invention.

FIG. 14 is a diagram showing the upper electrode structure of a plasma etching apparatus according to a modification of the sixth embodiment of the present invention. In this modification, a supplementary electrode 235 having a ring shape is disposed around the upper electrode 234, and is connected to the variable DC power supply 50 through a switch 243. When the supplementary electrode 235 is supplied with the DC voltage, the electrode 235 can serve as a part of the upper electrode. With this arrangement, it is possible to improve the plasma density uniformity in addition to the flexibility of the plasma density distribution being higher.

Seventh Embodiment

Figure 15:
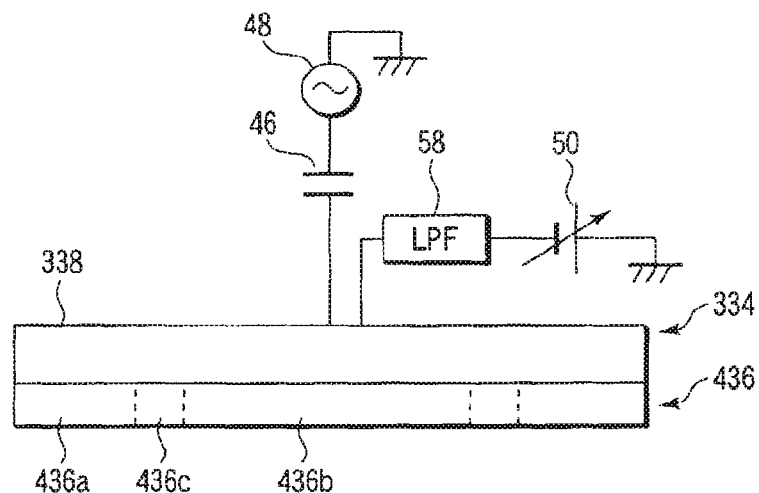
FIG. 15 is a diagram showing the upper electrode structure of a plasma etching apparatus according to a seventh embodiment of the present invention.

FIG. 15 is a diagram showing the upper electrode structure of a plasma etching apparatus according to a seventh embodiment of the present invention. In this embodiment, an upper electrode 334 comprises an electrode support 338 and an electrode plate 436 disposed therebelow and having portions different in electric resistivity. Specifically, low resistivity portions 436a and 436b having a ring shape and a circular shape are disposed on the outermost and central portions of the electrode support 338, respectively, and a high resistivity portion 436c is disposed therebetween. The resistivity of the low resistivity portions 436a and 436b is set to be low enough to allow a DC current from the variable DC power supply 50 to sufficiently flow therethrough. The resistivity of the high resistivity portion 436c is set to be high enough to substantially prevent a DC current from the variable DC power supply 50 from flowing therethrough, while allowing an RF current from the first RF power supply 48 to flow therethrough. The other structures of this embodiment are the same as those shown in FIG. 1.

In this embodiment, when plasma etching is performed, an RF current from the first RF power supply 48 flows into the entirety of the electrode plate 436. A DC current from the variable DC power supply 50 flows only into the outermost and central portions of the electrode plate 436. With this arrangement, the distribution of an RF electric field and a DC electric field below the upper electrode 334 can be more finely controlled, as compared to the fourth embodiment. Consequently, the controllability of the plasma density distribution is remarkably improved.

Eighth Embodiment

Figure 16:
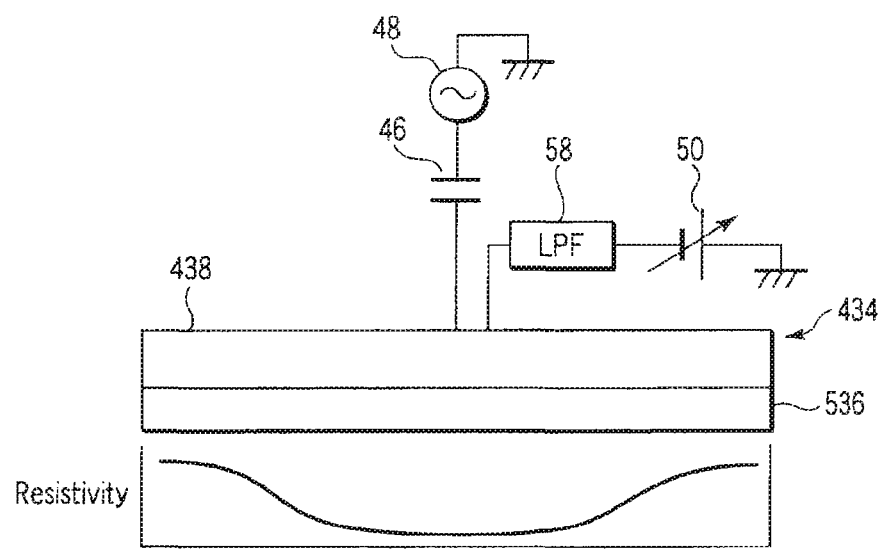
FIG. 16 is a diagram showing the upper electrode structure of a plasma etching apparatus according to an eighth embodiment of the present invention.

FIG. 16 is a diagram showing the upper electrode structure of a plasma etching apparatus according to an eighth embodiment of the present invention. In this embodiment, an upper electrode 434 comprises an electrode support 438 and an electrode plate 536 disposed therebelow and having a transition of electric resistivity. Specifically, as shown on the lower side of FIG. 16, an electric resistivity gradation is formed in the electrode plate 536 such that the resistivity is the lowest at the central portion and is gradually increased toward the peripheral portion. The resistivity of the peripheral portion, which is the highest, is set to be high enough to substantially prevent a DC current from a variable DC power supply 50 from flowing therethrough, while allowing an RF current from a first RF power supply 48 to flow therethrough. The resistivity of the central portion is set to be low enough to allow a DC current from the variable DC power supply 50 to sufficiently flow therethrough. The other structures of this embodiment are the same as those shown in FIG. 1.

In this embodiment, when plasma etching is performed, an RF current from the first RF power supply 48 flows into the entirety of the electrode plate 536. A DC current from the variable DC power supply 50 does not substantially flow into the peripheral portion of the electrode plate 536, which is the highest in resistivity. Further, some DC current flows into the middle portion with an electric resistivity transition between the peripheral portion and central portion, depending on the electric resistivity. With this arrangement, the distribution of an RF electric field and a DC electric field is formed in accordance with the peripheral portion, central portion, and middle portion. Consequently, the controllability of the plasma density distribution is improved, as compared to the fourth embodiment.

Matters Common to First to Eighth Embodiments

The present invention is not limited to the embodiments described above, and it may be modified in various manners.

Figure 17:
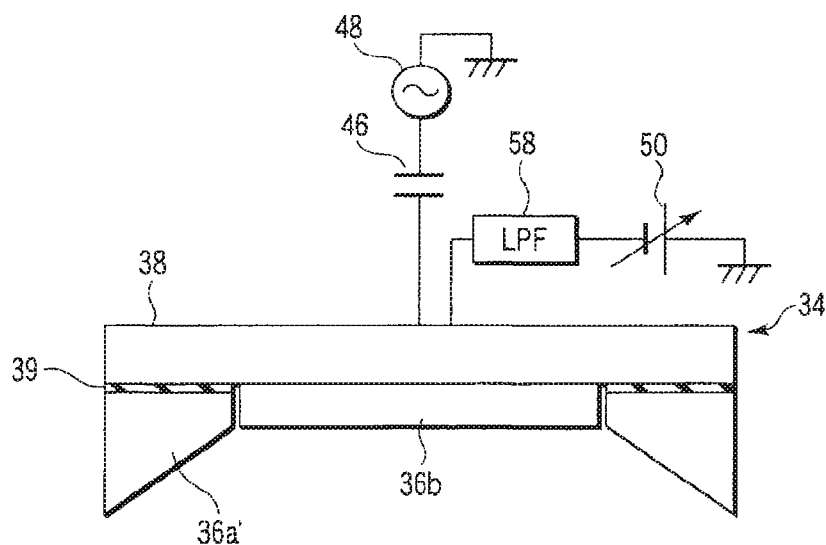
FIG. 17 is a diagram showing a modified upper electrode structure.

For example, the upper electrode is not necessarily horizontal. FIG. 17 is a diagram showing a modified upper electrode structure. As shown in FIG. 17, the first embodiment may be modified such that the upper electrode 34 is provided with a tapered outer electrode plate 36a'. This arrangement makes it possible to improve the plasma uniformity. The other embodiments may be also modified in the same way, so that the same effect is obtained.

The embodiments described above are exemplified by a plasma etching apparatus of the type that applies an RF power for plasma generation and a DC voltage to the upper electrode. The present invention may be applied to a plasma etching apparatus of another type, such as a type that applies an RF power for plasma generation and a DC voltage to the lower electrode.

In the embodiments described above, the present invention is applied to plasma etching, for example. Alternatively, the present invention may be applied to another plasma process, such as sputtering or plasma CVD. Further, the target substrate is not limited to a semiconductor wafer, and it may be another substrate, such as a glass substrate used for an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus comprising:
a process container configured to accommodate a target substrate and to be vacuum-exhausted;
a first electrode and a second electrode disposed opposite each other within the process container;
a radio frequency (RF) power supply configured to apply an RF power to the first electrode;
a direct current (DC) power supply configured to apply a DC voltage to the first electrode; and
a process gas supply system configured to supply a process gas into the process container, such that plasma of the process gas is generated between the first electrode and the second electrode to perform a plasma process onto a target substrate,
wherein the first electrode is an upper electrode, and the second electrode is a lower electrode configured to place the target substrate thereon,
wherein the first electrode includes an electrode plate and a conductive electrode support that supports the electrode plate,
wherein the RF power supply and the DC power supply are connected to the electrode plate through the electrode support,
wherein the electrode plate is a single electrode plate that includes a low resistivity region and a high resistivity region, such that the low resistivity region is disposed on a central side of the electrode plate and the high resistivity region is disposed around the low resistivity region,
the electrode plate is supported by the electrode support in a state in contact with a lower surface of the electrode support over the low resistivity region and the high resistivity region, and
the low resistivity region and the high resistivity region have resistivity set such that when the RF power and the DC voltage are applied from the RF power supply and the DC power supply to generate plasma of the process gas, an RF current from the RF power supply flows through the electrode support into both of the low resistivity region and the high resistivity region, and a DC current from the DC power supply flows through the electrode support into the low resistivity region but is prevented from flowing into the high resistivity region.

2. The apparatus according to claim 1, wherein the electrode plate further includes an outer low resistivity region disposed on a peripheral side of the electrode plate such that the high resistivity region is disposed between the low resistivity region on the central side and the outer low resistivity region.

3. The apparatus according to claim 2, wherein the electrode plate is supported by the electrode support in a state in contact with a lower surface of the electrode support over the low resistivity region, the high resistivity region, and the outer low resistivity region.

4. The apparatus according to claim 1, wherein the electrode plate has a resistivity gradation formed therein such that resistivity is gradually increased outward from a central side of the electrode plate and thereby the low resistivity region and the high resistivity region are formed.

5. The apparatus according to claim 4, wherein the electrode plate is supported by the electrode support in a state in contact with a lower surface of the electrode support over portions formed with the resistivity gradation.

6. The apparatus according to claim 1, wherein the RF power has a frequency of 13.56 MHz or more.

7. The apparatus according to claim 6, further comprising another RF power supply connected to the second electrode and configured to apply an RF power for ion attraction.

8. The apparatus according to claim 1, wherein the process gas supply system is configured to supply as the process gas an etching gas for performing etching onto the target substrate as the plasma process.

9. The apparatus according to claim 1, wherein the electrode plate has a resistivity difference formed by doping, between the low resistivity region and the high resistivity region.

10. The apparatus according to claim 1, wherein the electrode plate has a resistivity difference formed by bonding different materials, between the low resistivity region and the high resistivity region.

* * * * *